United States Patent
Caveney et al.

(10) Patent No.: US 10,406,679 B2
(45) Date of Patent: Sep. 10, 2019

(54) UNEQUAL LINK SCARA ARM

(71) Applicant: BROOKS AUTOMATION, INC., Chelmsford, MA (US)

(72) Inventors: Robert T. Caveney, Windham, NH (US); David Martin, Santa Clara, CA (US); Ulysses Gilchrist, San Jose, CA (US)

(73) Assignee: Brooks Automation, Inc, Chelmsford, MA (US)

( * ) Notice: Subject to any disclaimer, the term of this patent is extended or adjusted under 35 U.S.C. 154(b) by 431 days.

(21) Appl. No.: 15/012,425

(22) Filed: Feb. 1, 2016

(65) Prior Publication Data
US 2016/0221183 A1     Aug. 4, 2016

Related U.S. Application Data

(63) Continuation of application No. 11/179,762, filed on Jul. 11, 2005, now Pat. No. 9,248,568.

(51) Int. Cl.
*B25J 9/04* (2006.01)
*H01L 21/677* (2006.01)

(52) U.S. Cl.
CPC ........ *B25J 9/042* (2013.01); *H01L 21/67766* (2013.01)

(58) Field of Classification Search
CPC ... B25J 9/041; B25J 9/042; B25J 9/043; B25J 9/106; B25J 13/088; H01L 21/67742;
(Continued)

(56) References Cited

U.S. PATENT DOCUMENTS

| | | |
|---|---|---|
| 4,715,921 A | 12/1987 | Maher et al. |
| 4,781,512 A | 11/1988 | Ohta et al. |

(Continued)

FOREIGN PATENT DOCUMENTS

| | | |
|---|---|---|
| EP | 1498228 | 1/2005 |
| JP | 2000133690 | 5/2000 |

(Continued)

OTHER PUBLICATIONS

International Search Report, International Application No. PCT/US06/26584, dated Sep. 21, 2007.

*Primary Examiner* — Saul Rodriguez
*Assistant Examiner* — Brendan P Tighe
(74) *Attorney, Agent, or Firm* — Perman & Green, LLP; Colin C. Durham

(57) ABSTRACT

A substrate transport apparatus comprising a drive section, a controller, an upper arm, forearm and substrate holder. A proximate end of the upper arm being rotatably mounted to the drive section at a shoulder joint. A proximate end of the forearm being rotatably mounted to a distal end of the upper arm at an elbow joint. The substrate holder being rotatably mounted to a distal end of the forearm at a wrist joint. The upper arm and the forearm being unequal in length from joint center to joint center. The substrate transport arm is adapted to transport substrate to and from at least two substrate holding areas with the drive section of the transport apparatus remaining in a fixed position relative to the holding areas. Each of the upper arm, forearm and substrate holder being independently rotatable with respect to each other.

13 Claims, 14 Drawing Sheets

(58) Field of Classification Search
CPC ......... H01L 21/67766; H01L 21/68707; Y10S 414/141; Y10S 700/90; Y10T 74/20323
USPC .......................... 414/744.5; 901/15, 17, 21
See application file for complete search history.

(56) References Cited

U.S. PATENT DOCUMENTS

| | | | |
|---|---|---|---|
| 5,102,280 A | 4/1992 | Poduje et al. | |
| 5,314,293 A | 5/1994 | Carlisle et al. | |
| 5,374,147 A * | 12/1994 | Hiroki | H01L 21/68707 |
| | | | 414/217 |
| 5,404,894 A | 4/1995 | Shiraiwa | |
| 5,431,529 A | 7/1995 | Eastman et al. | |
| 5,512,320 A | 4/1996 | Turner et al. | |
| 5,513,946 A | 5/1996 | Sawada et al. | |
| 5,534,761 A | 7/1996 | Crippa | |
| 5,611,655 A | 3/1997 | Fukasawa et al. | |
| 5,741,113 A | 4/1998 | Bacchi et al. | |
| 5,765,983 A | 6/1998 | Caveney et al. | |
| 5,789,890 A | 8/1998 | Genov et al. | |
| 6,121,743 A | 9/2000 | Genov et al. | |
| 6,297,611 B1 * | 10/2001 | Todorov | B25J 9/042 |
| | | | 318/567 |
| 6,400,115 B1 | 6/2002 | Yamazoe | |
| 6,593,718 B1 | 7/2003 | Yamazoe | |
| 2001/0041129 A1 | 11/2001 | Tsuneda et al. | |
| 2003/0108415 A1* | 6/2003 | Hosek | B25J 9/1664 |
| | | | 414/783 |
| 2004/0131461 A1 | 7/2004 | Momoki | |
| 2005/0079042 A1* | 4/2005 | Maeda | B25J 9/042 |
| | | | 414/744.2 |

FOREIGN PATENT DOCUMENTS

| | | |
|---|---|---|
| JP | 2002137181 | 5/2002 |
| JP | 2002522238 | 7/2002 |
| JP | 2003517717 | 5/2003 |
| JP | 2003170384 | 6/2003 |
| JP | 2003220586 | 8/2003 |
| KR | 100267617 | 10/2000 |
| TW | 510847 | 11/2002 |

* cited by examiner

UNEQUAL LINK SCARA ARM

CROSS REFERENCE TO RELATED APPLICATIONS

This application is a continuation of U.S. patent application Ser. No. 11/179,762 filed on Jul. 11, 2005, the disclosure of which is incorporated by reference herein its entirety.

BACKGROUND

1. Field

The exemplary embodiments relate to a substrate transport apparatus and, more particularly, to a substrate transport apparatus with an articulated arm.

2. Brief Description of Related Developments

Contemporary SCARA arm robots used for transporting substrate have equal length links (i.e. upper arm and forearm). When the upper arm and forearm are of the same length the SCARA arm has a limited containment to extension ratio, the containment reflecting the footprint (generally commensurate to the swing diameter of the retracted arm) of the robot and the extension being the maximum reach of the robot arm. In conventional arms, to enable greater extension of a robot with equal length links the links of the robot are increased in length by the same amount. In conventional arms, the end effector rotation will track with the rotation of the upper arm. The end effector remains parallel to and along the axis of radial extension of the arm. Due to the increased linkage length, the swing diameter (i.e. the footprint) of the robot while in the retracted position also increases.

Various types of substrate transport apparatus are known in the art. Examples of conventional substrate transport apparatus are discussed in U.S. Pat. Nos. 5,741,113 ('113) and 5,611,655 ('655). U.S. Pat. No. '113 discusses a multiple link robot arm mechanism that uses two motors to rotate the upper arm and forearm. The motors are capable of synchronized operation to permit movement of the robot arm hand along a curvilinear path as the extension of the hand changes. The hand rotates about a wrist axis in response to rotation of the forearm about an elbow axis. U.S. Pat. No. '655 discusses a transport having a multi-joint arm with three links where each of the links are independently rotatable. The arms are driven by a drive unit having three motors. In both '113 and '655 the upper arm and forearm of the robots are equal in length. As such, longer reach of the arms in '113 and '655 means a larger footprint. In addition, at least in '113 the end effector is not orthogonal to the substrate holding area.

SUMMARY OF THE EXEMPLARY EMBODIMENTS

In accordance with a first exemplary embodiment, a substrate transport apparatus is provided. The substrate transport apparatus comprises a drive section, a controller operably connected to the drive section and a substrate transport arm. The substrate transport arm comprises an upper arm, a forearm and a substrate holder. A proximate end of the upper arm being rotatably mounted to the drive section at a shoulder joint. A proximate end of the forearm being rotatably mounted to a distal end of the upper arm at an elbow joint. The substrate holder being rotatably mounted to a distal end of the forearm at a wrist joint. The upper arm and forearm being unequal in length from joint center to joint center. The substrate transport arm is adapted to transport substrate to and from at least two substrate holding areas with the drive section remaining in a fixed position relative to the holding areas.

In accordance with another exemplary embodiment, a substrate transport apparatus with a SCARA arm is provided. The substrate transport apparatus comprises an upper arm, a forearm and a substrate holder. The transport apparatus having an extension length and swing diameter in accordance with the length of the upper arm, forearm and substrate holder. The upper arm and forearm being unequal in length. The independently rotatable upper arm and forearm and the independently rotatable substrate holder effecting a maximum length extension of the transport apparatus for a predetermined swing diameter.

In accordance with yet another exemplary embodiment, a substrate transport apparatus is provided. The substrate transport apparatus comprises a three link arm for selectably transporting substrates into two spaced inline substrate holding stations facing the same direction or into another three spaced inline substrate holding stations facing the same direction. A wrist of the three link arm travels along parallel paths to each substrate holding station and a drive section of the three link arm is fixed relative to the holding stations.

In accordance with a method of an exemplary embodiment, a method of transporting a substrate is provided. The method comprising providing a substrate transport apparatus with a drive section having a frame and a first, second and third drives. Providing an arm assembly, the arm assembly having an independently rotatable upper arm and an independently rotatable forearm and an independently rotatable substrate holder for holding the substrate. The upper arm and forearm being of unequal length from joint center to joint center and rotatably joined to each other at an end, the upper arm being rotatably joined to the frame at an opposite end. The substrate holder being rotatably joined to a distal end of the forearm at a wrist joint. Energizing the first second and third drives for effecting individual rotation of each of the upper arm, forearm and substrate holder and effecting movement of the substrate on the substrate holder along a radial line wherein the substrate holder rotates about the center of the substrate.

BRIEF DESCRIPTION OF THE DRAWINGS

The foregoing aspects and other features of the present invention are explained in the following description, taken in connection with the accompanying drawings, wherein.

DETAILED DESCRIPTION OF THE EXEMPLARY EMBODIMENT(S)

Figure 1:
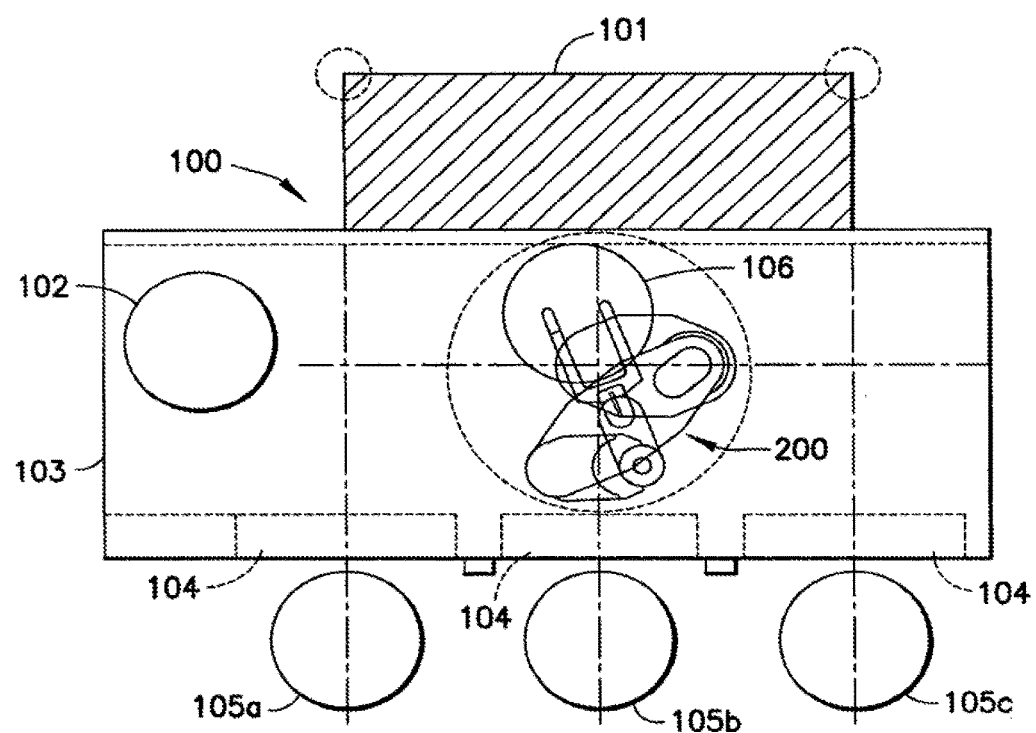
FIG. 1 is an schematic top plan view of a substrate processing apparatus in accordance with an exemplary embodiment.

Referring to FIG. 1, there is shown a schematic top plan view of a substrate processing apparatus 100 incorporating features in accordance with an exemplary embodiment. Although the embodiments disclosed will be described with reference to the embodiments shown in the drawings, it should be understood that the embodiments disclosed can be embodied in many alternate forms of embodiments. In addition, any suitable size, shape or type of elements or materials could be used.

The substrate processing apparatus may be for example, an equipment front end module (EFEM) or any other suitable processing apparatus. The processing apparatus 100 generally comprises a frame 103, a substrate transporter 200, substrate holding areas 105, load ports 104, and a staging position 101. The apparatus 100 may also include a substrate pre-aligner 102. The configuration of the processing apparatus 100 shown in FIG. 1, and its holding or processing areas is merely exemplary and in alternate embodiments the processing apparatus may have any suitable arrangement with an suitable processing or holding areas.

The transporter 200 is mounted within the frame 103 and transports substrates 106 back and forth from the holding areas 105 to the staging area 101. The staging area 101 may be a substrate elevator, load lock or other desired device. For example, a load lock may b located in the staging area providing a gateway to a substrate processing chamber. The processing chamber may be an atmospheric or vacuum chamber. In alternate embodiments the staging area 101 may be configured as a stocker or sorter or metrology device. The transporter 200 may also place the substrate on the pre-aligner 102 so that a fiducial (not shown) located on the substrate 106 is oriented in a predetermined position before the transporter 200 places the substrate 106 in the staging area 101. The substrate 106 may be a 200 mm, 300 mm or any desired diameter wafer, a flat panel for flat panel displays, or a reticle mask or any other desired workpiece.

Figure 2:
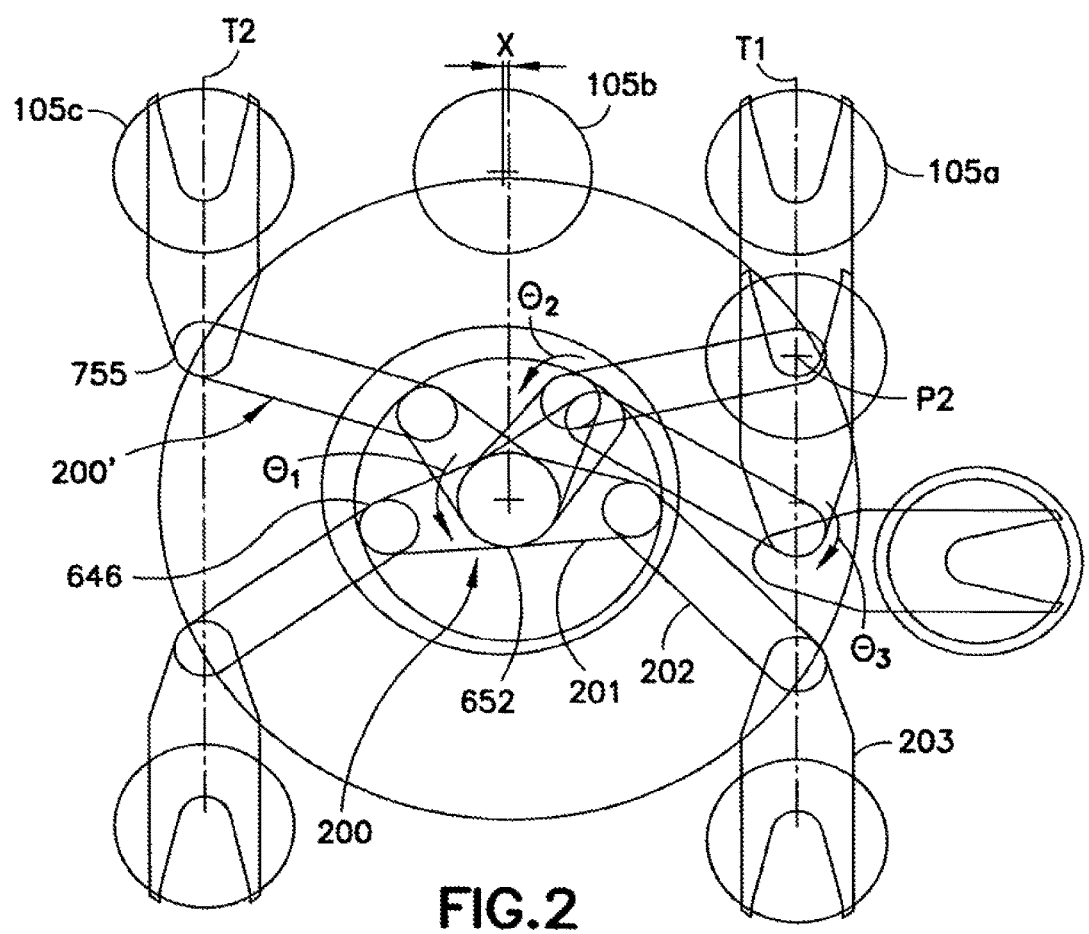
FIG. 2 is a schematic top plan view of a substrate transporter in accordance with an exemplary embodiment showing the transport arm in several positions.
Figure 5:
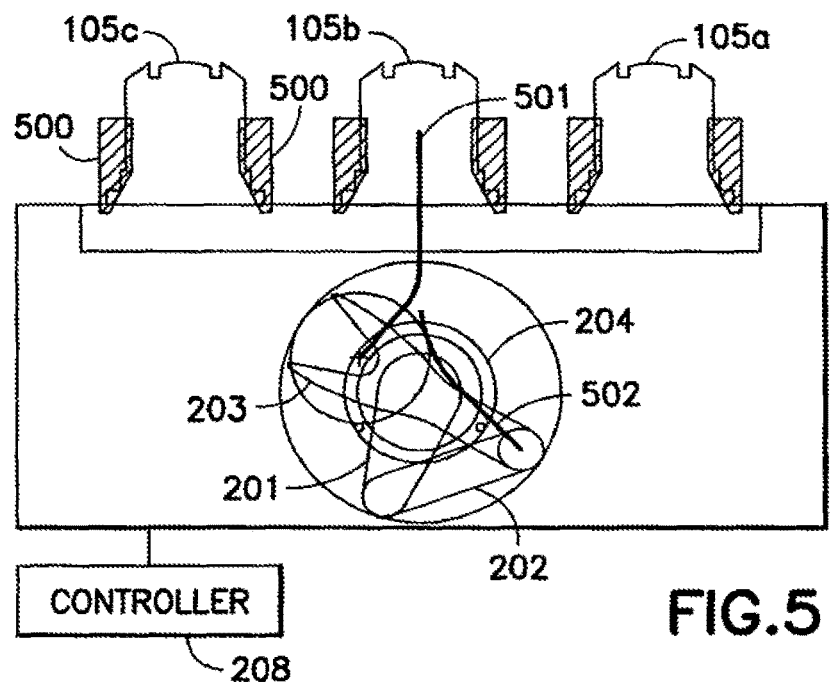
FIG. 5 is yet another schematic top plan view of a transporter in accordance with still another exemplary embodiment.
Figure 7:
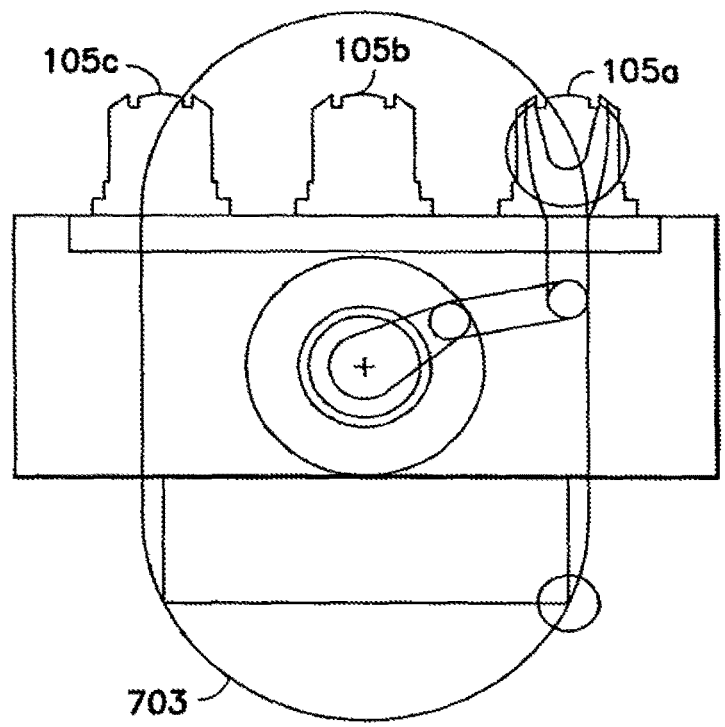
FIG. 7 is another schematic top plan view of a substrate processing apparatus in accordance with still another exemplary embodiment.
Figure 6:
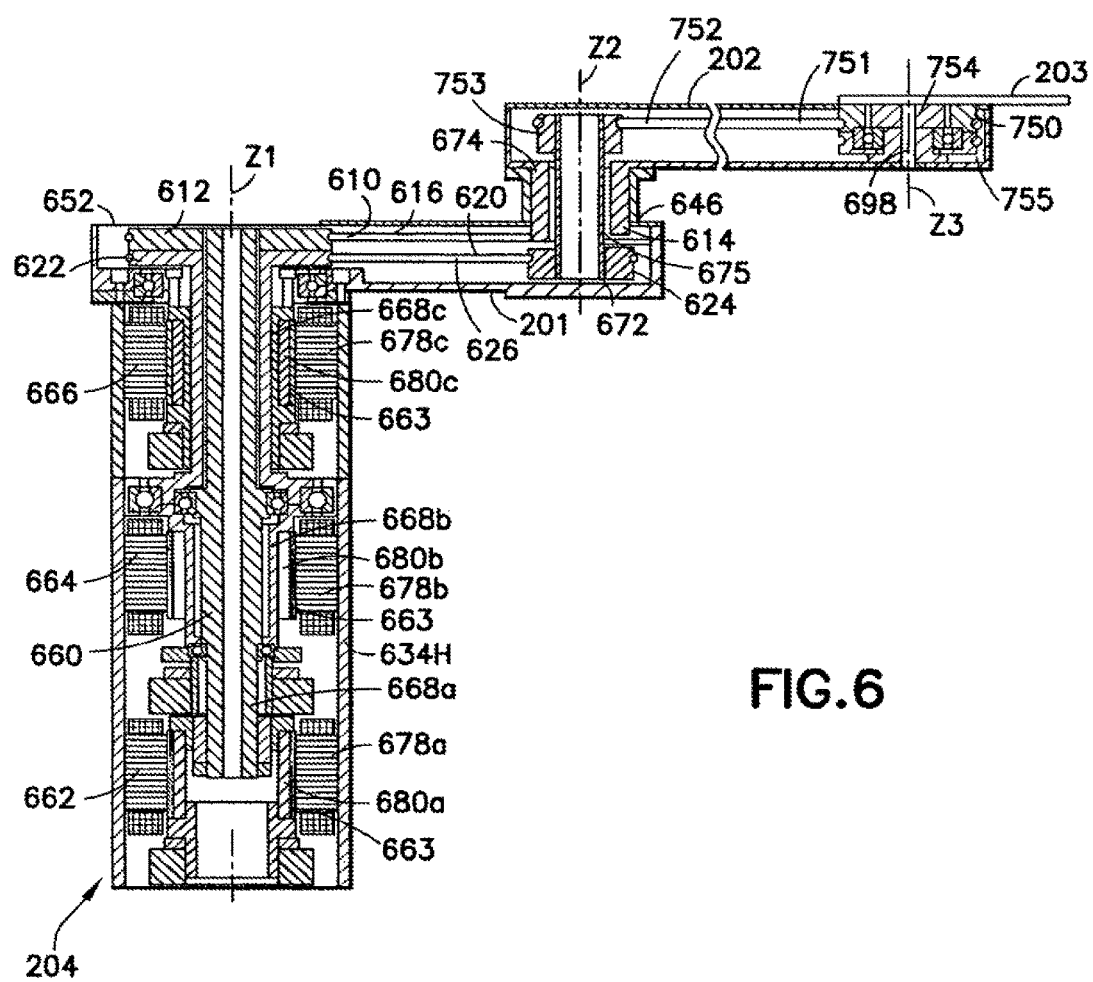
FIG. 6 is a cross sectional view of the transporter showing a drive system of the transporter in accordance with yet another exemplary embodiment.

Referring now to FIGS. 2, 5 and 6, the substrate transporter generally comprises an arm assembly with an upper arm 201, a forearm 202, a substrate holder 203, a drive section 204. A controller 208 may be connected to the arm assembly to move the arm sections of the assembly as desired. In alternate embodiments, the arm assembly may have any other desired general SCARA configuration. For example, the assembly may have multiple forearms and/or multiple substrate holders.

The substrate holder 203 is rotatably connected to the forearm 202 by shaft assembly 754 at a wrist 755 of the transporter 200. Substrate holder 203 may be rotatably connected by support shaft 698 to the forearm 202. In this exemplary embodiment, the substrate holder 203 is shown as a forked end effector. The substrate holder may have active mechanical or passive edge gripping. In alternate embodiments, the substrate holder may be a paddle end effector with a vacuum chuck. The forearm 202 is rotatably connected by a coaxial shaft assembly 675 to the upper arm 201 at elbow 646 of the transporter 200. The upper arm 201 is rotatably connected at the shoulder 652 to drive section 204. In this exemplary embodiment the upper arm 201 and the forearm 202 are unequal in length. The upper arm 201, for example, may be shorter in length than forearm 202.

Figure 3A:
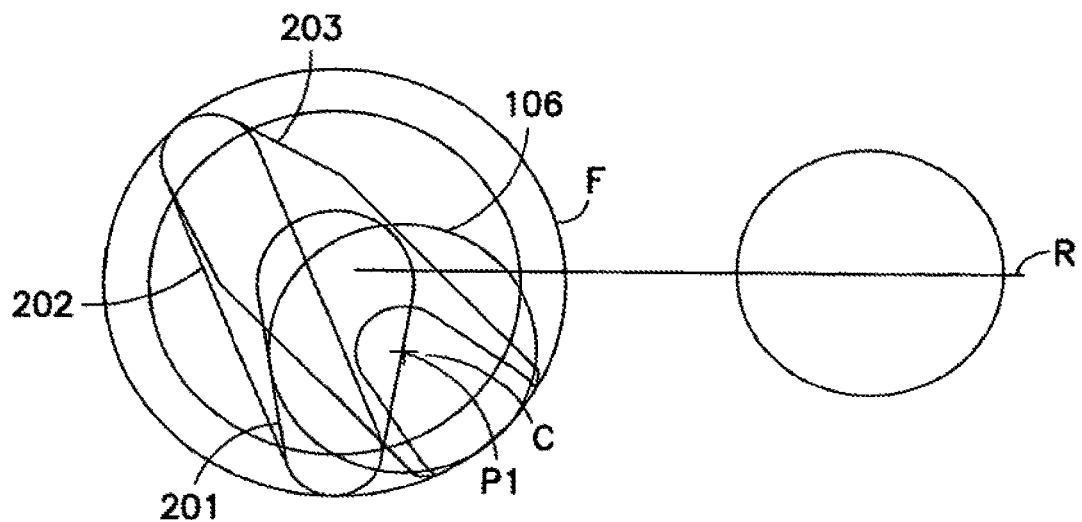
FIGS. 3A-3H and 3J are schematic top plan views showing the transporter in FIG. 2 in a number of positions through which the transporter transitions during extension/retraction.

The unequal lengths of the upper arm 201 and forearm 202, for example, may allow the swing diameter of the arm assembly, while in a retracted position, to remain the same as the swing diameter of a conventional arm assembly with an upper arm and forearm being of equal lengths. However, the unequal lengths of the upper arm 201 and forearm 202 of the arm assembly 200' in this exemplary embodiment may allow, for example, a greater reach (i.e. a greater extension) than an arm having equal length links with the same swing diameter thus, increasing the reach to containment ratio of arm 200'. FIG. 3A shows the swing diameter (i.e. footprint illustrated by circle F) of the transporter arm assembly 200'. As may be realized, the swing diameter's value of a SCARA arm in general is determined, for example, by either the combination of the substrate holder offset, wafer diameter, wrist radius or the upper arm's elbow swing radius. Hence, for the same length substrate holder offset, a conventional SCARA arm and arm assembly 200' would have substantially the same footprint. For example, the forearm 202 of this exemplary embodiment is able to grow longer than the upper arm 201 to a maximum ratio established by the constraints of the system (e.g. the desired footprint). In addition, in this exemplary embodiment the upper arm 201, forearm 202 and substrate holder 203 may be independently rotatable and driven by separate motors as will be described below. In alternate embodiments, one or more of the arm assembly arm sections may not be independently rotatable.

In the exemplary embodiment shown, drive section 204 may have an outer housing 634H which houses a coaxial shaft assembly 660, and three motors 662, 664, 666. In alternate embodiments, the drive section could have more or fewer than three motors. The drive shaft assembly 660 has three drive shafts 668a, 668b, 668c. In alternate embodiments more or fewer than three drive shafts could be provided. The first motor 662 comprises a stator 678a and a rotor 680a connected to the inner shaft 668a. The second motor 662 comprises a stator 678b and a rotor 680b connected to the middle shaft 668b. The third motor 666 comprises a stator 678c and a rotor 680c connected to the outer shaft 668c. The three stators 678a, 678b, 678c are stationarily attached to the housing 634H at different vertical heights or locations along the housing. In this embodiment the first stator 678a is the bottom stator, the second stator 678b is the middle stator and the third stator 678c is the top stator. Each stator generally comprises an electromagnetic coil. The three shafts 668a, 668b, and 668c are arranged as coaxial shafts. The three rotors 680a, 680b, 680c are preferably comprised of permanent magnets, but may alternatively comprise a magnetic induction rotor which does not have permanent magnets. Sleeves 663 are located between the rotor 680 and the stators 678 to allow the transporter 200 to be useable in a vacuum environment with the drive shaft assembly 660 being located in a vacuum environment and the stators 678 being located outside of the vacuum environment. However, the sleeves 663 need not be provided if the transporter 200 is only intended for use in an atmospheric environment.

The first shaft 668a is the inner shaft and extends from the bottom stator 678a. The inner shaft has the first rotor 680a aligned with the bottom stator 678a. The middle shaft 668b extends upward from the middle stator 678b. The middle shaft has the second rotor 680b aligned with the second stator 678b. The outer shaft 668c extends upward from the top stator 678c. The outer shaft has the third rotor 680c aligned with the upper stator 678c. Various bearings are provided about the shafts 668 and the housing 634H to allow each shaft to be independently rotatable relative to each other and the housing 634H. Each shaft 668 may be provided with a suitable position sensor to signal the controller 208 (see FIG. 5) of the rotational position of the shafts 668 relative to each other and/or relative to the housing 634H. Any suitable sensor could be used, such as an optical or induction sensor.

The outer shaft 668c is fixedly connected to the upper arm 201 so that shaft 668c and upper arm 201 rotate together as a unit about axis Z1. The middle shaft 668b is connected to a first transmission 620 in the upper arm 201 and the inner shaft 668a is connected to a second transmission 610 in the upper arm 201 as shown in FIG. 6. The first transmission 620 preferably comprises a drive pulley 622, an idler pulley 624 and drive cables or belts 626. The drive pulley 622 is fixedly mounted to the top of the middle shaft 668b and is connected by drive belt 626 to the idler pulley 624. The idler pulley 624 is fixedly mounted to the bottom of the inner shaft 672 of coaxial shaft assembly 675 connecting the forearm 202 to the upper arm 201. The second transmission 610 in the upper arm 201 preferably comprises a drive pulley 612, an idler pulley 614 and drive belts or cables 616. Drive pulley 612 is fixedly mounted to the top of the inner shaft 668a of coaxial shaft assembly 660 in drive section 204. The idler pulley 614 is fixedly mounted to the bottom of the outer shaft 674 of the coaxial shaft assembly connecting the forearm 202 to the upper arm 201. Drive belt 616 connects the drive pulley 612 to the idler pulley 614. The diameter ratio between the idler and drive pulleys 624, 622 of the first transmission 626 and between the idler and drive pulleys 614, 612 of the second transmission 610 in this embodiment is about 1 to 1, though in alternate embodiments the ratio between the idler and drive pulleys may be as desired. The drive belts 616, 626 are configured to rotate the respective idler pulleys 614, 624 in the same direction as the corresponding drive pulley 612, 622 (e.g. clockwise rotation of drive pulleys 612, 622 causes clockwise rotation of idler pulleys 614, 624).

The coaxial shaft assembly 675 connecting the forearm 202 to the upper arm 201 is rotatably supported from the upper arm 201 by suitable bearings which allow the outer and inner shafts 674, 672 of the shaft assembly to rotate about axis Z2 relative to each other and to the upper arm 201. The outer shaft 674 of coaxial shaft assembly 675 is fixedly mounted to the forearm 202 so that the shaft 674 and forearm 202 rotate together as a unit about Z2. The forearm 202 is rotated about axis Z2 when the idler pulley 614 of the second transmission 610 in the upper arm 201 is rotated by inner shaft 668a of drive section 204. Thus, the inner shaft 668a of drive section 204 is used to independently rotate forearm 202 relative to the upper arm 201.

The inner shaft 672 of the coaxial shaft assembly is fixedly attached to drive pulley 753 of a third transmission 752 in the forearm 202. The third transmission 752 in the forearm 202 preferably comprises drive pulley 753, an idler pulley 750 and drive belts or cables 751. Idler pulley 750 is fixedly mounted to shaft 698. Drive belt 751 connects the drive pulley 753 to idler pulley 750. Shaft 698 is rotatably supported from the forearm 202 by suitable bearings which allow the shaft 698 to rotate about axis Z3 relative to the forearm 202. The diameter ratio between the idler and drive pulleys 750, 753 of the third transmission 752 in this embodiment is about 1 to 1, though in alternate embodiments the ratio between the idler and drive pulleys may be as desired. The drive belts 751 are configured to rotate the idler pulley 750 in the same direction as the drive pulley 753 (e.g. clockwise rotation of drive pulley 753 causes clockwise rotation of idler pulley 750).

Shaft 698 is fixedly mounted to the substrate holder 203. Thus, the shaft 698 and substrate holder 203 rotate together as a unit about axis Z3. The substrate holder 203 is rotated about axis Z3 when idler pulley 750 of the third transmission 752 is rotated by drive pulley 753. Drive pulley 753 in turn is rotated by inner shaft 672 of the coaxial shaft assembly 675. Inner shaft 672 is rotated when idler pulley 624 of the first transmission 626 in the upper arm 201 is rotated by middle shaft 268b of drive section 204. Hence, the substrate holder 203 may be independently rotated with respect to forearm 202 and upper arm 201 about axis Z3. In this exemplary embodiment the transporter arm assembly housing 634H is fixed to the processing apparatus frame 100 so that the shoulder 652 rotates about a fixed point and does not move laterally within the frame. In alternate embodiments the transporter arm assembly housing may be mounted on a traverser so that the shoulder may move laterally within the frame.

Referring now to FIGS. 2, 3A-H, 3J, 5 and 6, the transporter arm assembly 200' may be extended and retracted using drive section 204 to the positions shown in FIGS. 2, 3A-3H and 3J or any other desired position. To extend the arm assembly 200' the controller 208 may send a signal to motors 662, 664, 666 so that their respective shafts 668a, 668b, 668c are independently rotated either clockwise or counterclockwise to effect the extension of the arm 200'.

Figure 10:
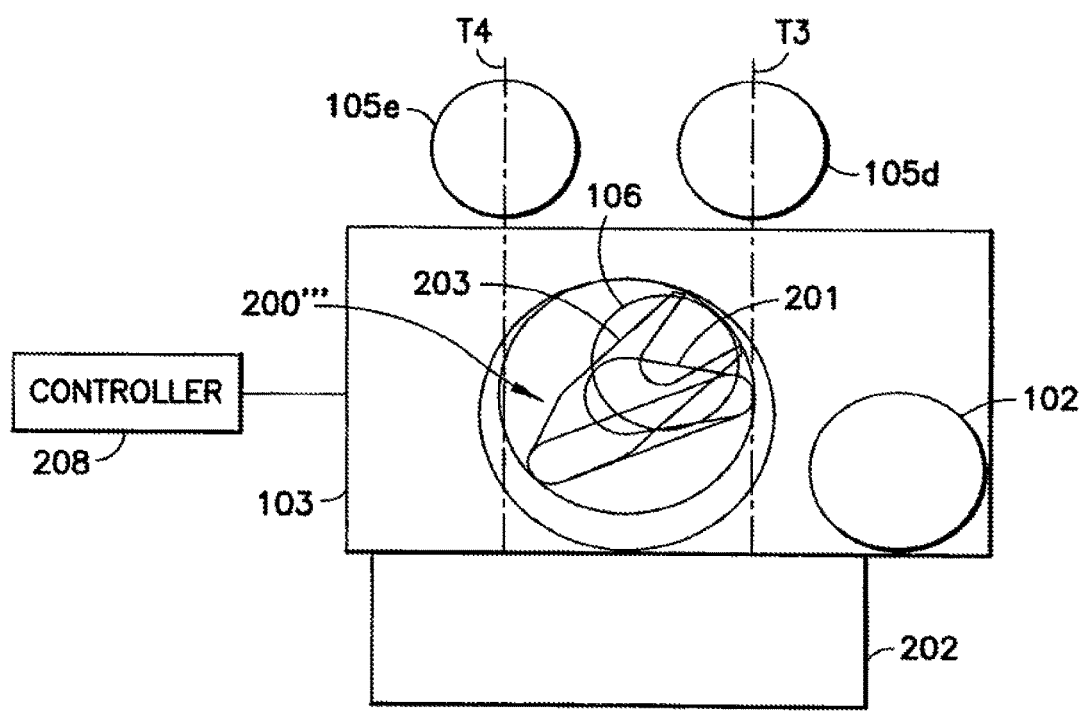
FIG. 10 is a schematic top plan view of a substrate processing apparatus in accordance with yet another exemplary embodiment.

Substrate holding areas 105a-c (and 105d-e as shown in FIG. 10) may be substrate transport container holding areas capable of holding substrate transport containers (e.g. FOUPs). In this exemplary embodiment there are three substrate holding areas shown but in alternate embodiments there may be more or less than three. For example, in the exemplary embodiment shown in FIG. 10 there are two substrate holding areas. The substrate holding areas 105a-c may be aligned with processing apparatus load ports and spaced apart from each other in accordance with SEMI Standards. The FOUPs that may be located in the substrate holding areas 105a-c may hold substrate cassettes with multiple holding stations for batch processing. The FOUPs and holding stations are also arranged per SEMI Standards.

FOUP exclusion areas 500 are also defined in the SEMI Standards and are shown in FIG. 5. The FOUP exclusion areas 500 chanelize the transport path 501 of the substrate so that the path is substantially orthogonal to the face of the FOUP. In this exemplary embodiment the substrate holder 203 may be oriented to avoid violating the exclusion areas 500.

The controller 208 may have a cluster architecture as described in U.S. Provisional Patent Application Ser. No. 60/688,636 and U.S. Patent Application entitled "Scalable Motion Control System", (PAR) filed on Jul. 11, 2005 which are both incorporated herein by reference in their entirety.

The controller 208 may control the rotational direction and rate of rotation of arms 201, 202 and substrate holder 203 as will be described below.

Figure 11:
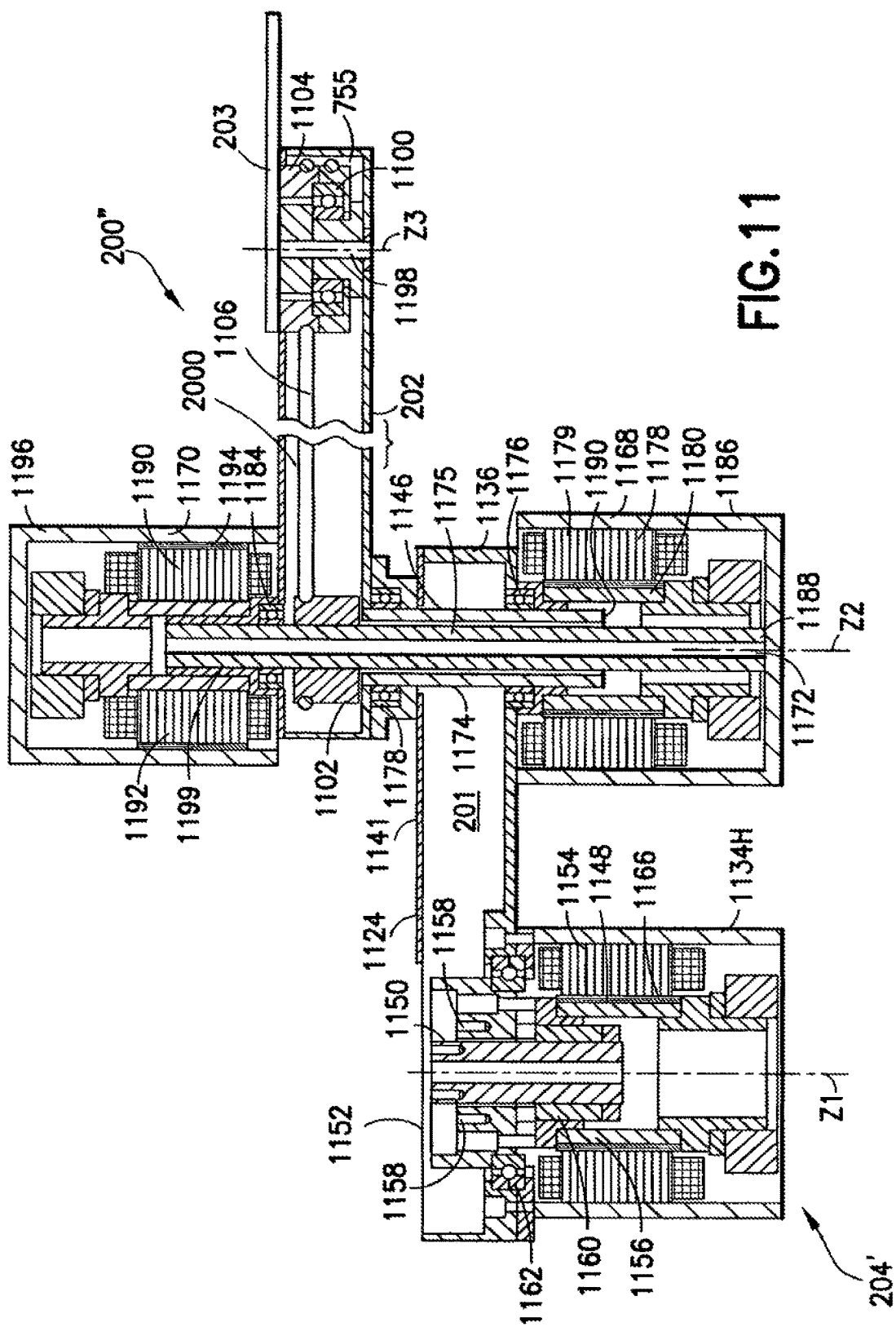
FIG. 11 is another cross sectional view of the transporter showing the drive system of the transporter in accordance with another exemplary embodiment.

Referring now to FIG. 11 a cross sectional view of a robot arm 200" and a drive section 204' in accordance with a second exemplary is shown. Drive section 204' comprises housing 1134H and a rotational motor located in the housing. In alternate embodiments, the drive section may have more than one rotational motor. The motor 1148 rotates shaft 1150 about an axis which is generally coincident to the center line Z1 of the shoulder joint 1152 of arm assembly 200". The shaft 1150 is fixedly held by suitable fasteners such as for example machine or cap screws to the upper arm link 201. Thus, the shaft 1150 and the upper arm link 201 rotate substantially as a unit. The shaft 1150 also has a portion 1160 which is rotatably captured in suitable bearings or bushings 1162 mounted to the drive section housing 1134H. A stop washer (not shown) may be mounted on the shaft 1150 to engage stops on the housing 1134H and to prevent inadvertent vertical motion between shaft 1150 and drive section 204'. The motor 1148 preferably includes a stator 1154, and a rotor 1156. The stator 1154 may include electro-magnetic coils or windings fixedly mounted to the housing 1134H which is mounted to frame 100 (see FIG. 1). The rotor 1156 is mounted to portion 1160 of shaft 1150. The rotor 1156 may include permanent magnets or a magnetic induction rotor which does not have permanent magnets. In alternate embodiments, the rotational motor for rotating the shaft in the drive section may be of any other suitable type such as a stepper motor. Sleeve 1166 may be installed between the stator 1154 and rotor 1156 to allow the robot 200" to be usable in a vacuum environment with the drive shaft 1150 being located in the vacuum environment and the stator 1154 being located outside the vacuum environment. The windings of the stator 1154 are configured to rotate the shaft 1150 in the clockwise or counter-clockwise directions as desired about the centerline Z1 of the shoulder joint 1152.

As seen in FIG. 11, the upper arm link 1140 has a coaxial shaft assembly 1175 connecting the forearm link 202 to the upper arm link 201 at the elbow joint 1146. The forearm link 202 is located above the upper arm link 201. The coaxial shaft assembly 1175 includes an outer shaft assembly 1174 and an inner shaft 1172. The outer shaft 1174 is fixedly mounted to the forearm 202 to rotate with the forearm as a unit about axis of rotation Z2 at the elbow 1146 of the arm assembly 200". The outer shaft 1174 is rotatably held to the upper arm 201 with suitable bearing or bushings 1178, 1176, so that the shaft may rotate relative to the upper arm link. Bearing 1178 may also be a suitable thrust bearing to vertically support the forearm link 202 from the upper arm link 201. In this embodiment, the robot 200" has two arm borne drive sections 1168, 1170. The lower drive section 1168 is mounted to the upper arm link 201 to drive the outer shaft 1174 connecting the forearm link 202 to the upper arm link 201. The upper drive section 1170 is mounted on the inner shaft 1172 to drive the drive pulley 1102, thus driving the substrate holder 203 as will be described in greater detail below. In alternate embodiments, the arm assembly may have one arm borne two-axis drive section capable of independently driving the outer shaft and drive pulley of the coaxial shaft assembly connecting the forearm link to the upper arm link. The lower drive section 1168 is substantially similar to the drive section 204'. The lower drive section may have a rotational motor 1179 with a stator 1178 and a rotor 1180. The stator 1178, which may comprise suitable electro-magnetic windings, is fixedly mounted by appropriate structure to the upper arm link 201. The rotor 1180, which may comprise permanent magnets or an electro-inductive rotor, is mounted onto the outer shaft 1174. The windings on the stator 1178 are configured to rotate the outer shaft 1174 about axis Z2 in both a clockwise or counter-clockwise rotation relative to the upper arm link 201.

The inner shaft 1172 is rotatably held by suitable bearings 1182, 1184 to the forearm link 202. Bearing 1182 is preferably a thrust bearing which vertically supports the upper drive section 1170 from the forearm link 202. The forearm link 202 and the substrate holder 203 are then vertically supported from the upper arm link by thrust bearing 1178 as previously described. The lower end 1188 of the inner shaft 1172 is fixedly mounted to the upper arm link 201. In the shown exemplary embodiment, the inner shaft 1172 extends out of the bottom 1190 of the outer shaft 1174 and is connected at the bottom 1188 to structure 1186 depending from the upper arm link 201. Thus, in this embodiment, the inner shaft 1172 is stationary relative to the upper arm link 201.

As noted previously, the upper arm borne drive section 1170 is mounted on inner shaft 1172 as shown in FIG. 11. The upper drive section 1170 has a rotational motor 1190 which rotates drive shaft 1199 and thus, drive pulley 1102 of transmission 2000 in the forearm 202 as will be described in more detail below.

The rotational motor 1190 of the upper drive section 1170 is preferably substantially similar to the motors 1148, 1179 in drive sections 204', 1168 of the robot 200". The motor 1190 has a stator 1192 comprising suitable electro-magnetic windings, and a rotor 1194 which may have permanent magnets or magnetic induction coil. However, in this case, the stator 1192 is mated to drive shaft 1199 which is fixedly attached to the drive pulley 1102, and the rotor 1194 is mounted to structure 1196, such as the housing of the upper drive section 1170, depending from the inner shaft 1172 which is fixedly attached to the upper arm link 201. In alternate embodiments, the upper drive section may include any other suitable rotational motor for rotating the substrate holder about axis Z3 relative to the upper arm link and forearm of the robot.

As seen in FIG. 11, forearm link 202 is a hollow tube having any suitable cross-section. The forearm link 202 houses transmission 2000 which connects shaft 1198 to drive pulley 1102. The transmission 2000 in the forearm 202 preferably comprises drive pulley 1102, an idler pulley 1104 and drive belts or cables 1106. The drive pulley 1102 is rotatably connected to inner shaft 1172 through, or example, force fitting a bearing (not shown) over shaft 1172, or by any other suitable means. The idler pulley 1104 is fixedly mounted to the support shaft 1198 such as, for example, by force fitting the pulley 1104 over shaft 1198. Drive belt 1106 connects the drive pulley 1102 to idler pulley 1104. Shaft 1198 is rotatably supported from the forearm 202 by suitable bearings 1100 that allow the shaft 1198 to rotate about axis Z3 relative to the forearm 202. The diameter ratio between the idler and drive pulley 1104, 1102 of the transmission 2000 in this embodiment is about 1 to 1, though in alternate embodiments the ratio between the idler and drive pulleys may be as desired.

The drive belts 1106 are configured to rotate the idler pulley 1104 in the same direction as the drive pulley 1102 (e.g. clockwise rotation of drive pulley 1102 causes clockwise rotation of idler pulley 1104). Belts 1106, connecting the drive pulley 1102 and idler pulley 1104 may be made of plastic, reinforced rubber or any other suitable material. Belt 1106 is disposed in a general loop configuration around the drive pulley 1102 and idler pulley 1104. The belt 1106 may be pre-tensioned as desired so that the belt is in no-slip contact with the pulleys 1102, 1104. In alternate embodiments, the pulleys and belt may be provided with meshing teeth to maintain a no-slip condition between the belt and pulleys.

Shaft 1198 is fixedly mounted to the substrate holder 203 and idler pulley 1104. Thus, the shaft 1198 and substrate holder 203 rotate together as a unit about axis Z3. The substrate holder 203 is rotated about axis Z3 when idler pulley 1104 of the transmission 2000 is rotated by drive pulley 1102. Drive pulley 1102 in turn is rotated by drive shaft 1199 of the coaxial shaft assembly 1175.

Substrate holder 203 is fixedly mounted on support shaft 1198. As described above, support shaft 1198 is rotatably mounted by suitable bearings 1100 to the forearm link 202 thereby allowing the forearm link 202 and substrate holder 203 to rotate relative to each other about axis of rotation Z3. For example, when upper drive section 1170 is energized the stator 1190 rotates drive shaft 1199 thereby rotating drive pulley 1102. Drive pulley in turn drives belt 1106 thus rotating idler pulley 1104. Idler pulley rotates shaft 1198 and substrate holder 203. The upper drive 1170 may be energized to rotate either in a clockwise or counterclockwise direction thereby rotating substrate holder in a clockwise or counterclockwise direction as desired.

Figure 12:
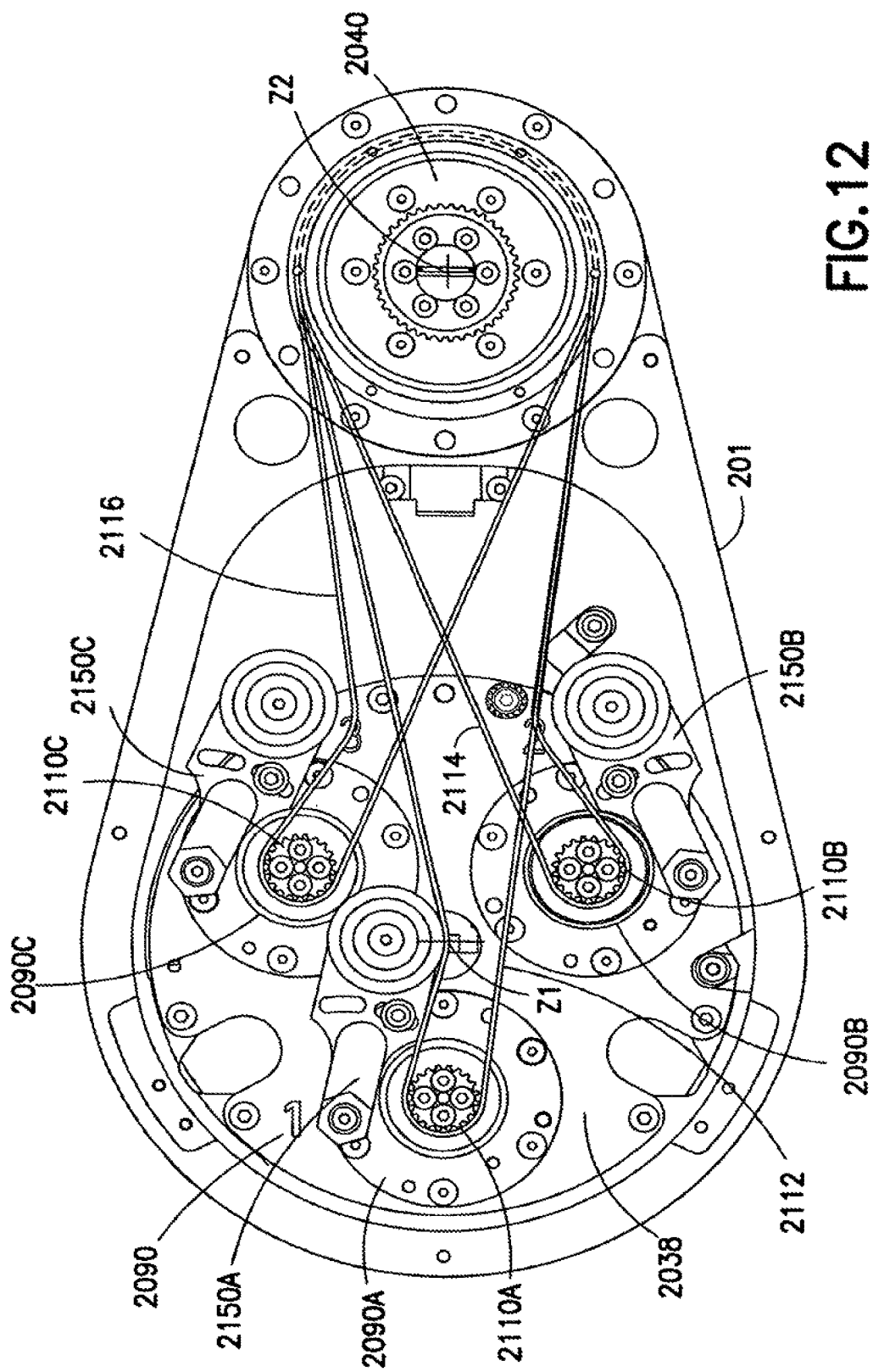
FIG. 12 is a top plan view of the upper arm section of a transporter in accordance with an exemplary embodiment.

Referring now to FIG. 12, a top plan view of upper arm link 201 is shown in accordance with a third exemplary embodiment. In this exemplary embodiment the drive motors 2090A, 2090B which drive the forearm 202 and substrate holder 203 may be located in within the upper arm link 201. As shown in FIG. 12, a third drive motor 2090C may be provided within the upper arm link 201 to drive a second substrate holder as can be seen in United States Patent Application entitled "Substrate Transport Apparatus", attorney docket number 390-011658-US (PAR) filed on Jul. 11, 2005, which is incorporated herein in its entirety.

In this exemplary embodiment the upper arm 201 may be driven in substantially the same way as upper arm 201 is driven by drive section 204 wherein motor 666 drives shaft 668c and shaft 668c is fixedly attached to upper arm 201. In this exemplary embodiment, the upper arm 201 may be a one-piece member (or may also be referred to as being of unitary construction). The upper arm 201 may be formed by casting, forging or any other suitable formation process. The upper arm may be made of metal, such as aluminum alloy, stainless steel or from non-metallic materials such as plastic, ceramic or composites. In alternate embodiments, the upper arm may have any other suitable shape.

Figure 8:
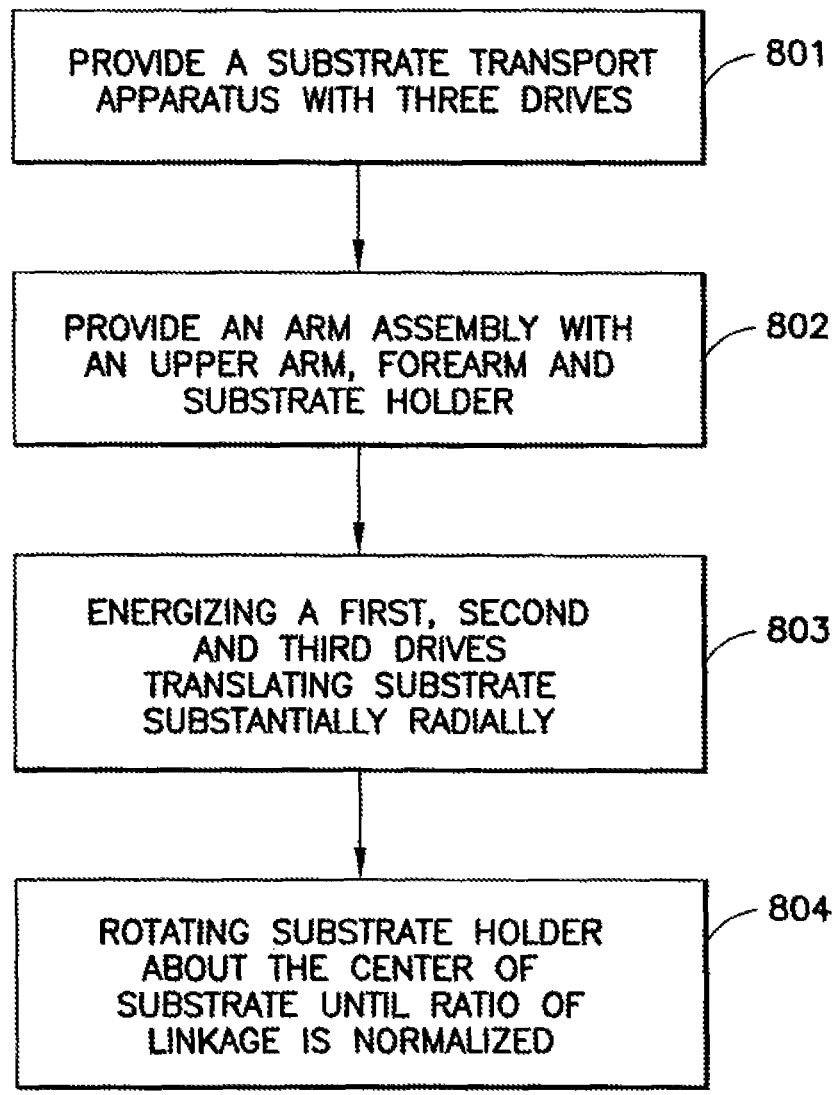
FIG. 8 is a flow diagram in accordance with a method of an exemplary embodiment.

As seen in FIG. 8, coaxial shaft assembly 2040 is mounted to the outward end of upper arm 201. Coaxial shaft assembly 2040 may be substantially similar to coaxial shaft assembly 675 described above however, coaxial shaft assembly 2040 may also have a third shaft and third pulley to drive an additional forearm or substrate holder. In alternate embodiments, coaxial shaft assemblies 2040, 675 may have any number of shafts and pulleys to drive a corresponding number of forearms and substrate holders. The forearm 202 is pivotally mounted to the upper arm 201 by coaxial shaft assembly 2040. Coaxial shaft assembly defines the elbow axis of rotation Z2.

As seen in FIG. 8, the respective drive pulleys 2110A, 2110B of the motor assemblies 2090A, 2090B, in the motor cluster, are connected to the corresponding pulleys of shaft assembly 2040 by transmission belts 2112, 2114, 2116. Drive pulley 2110A is connected by belt 2112 to pulley 614 (as seen in FIG. 6). Drive pulley 2110B is connected by belt 2114 to pulley 624 (as seen in FIG. 6). Belt tensioners 2150A, 2150B are mounted to the upper arm 201 to provide and maintain desired tension on the transmission belts. Thus when motor 2090A is energized, drive pulley 2110A rotates forearm 202 about axis Z2. When motor 2090B is energized, pulley 2110B rotates transfer pulley 624 about axis Z2, thereby driving substrate holder 203 via the transmission 752 located within forearm 202. In the embodiment shown, the drive pulley 2110A, 2110B to idler pulley 614, 624 diameter ratio may be about 1:4 though any suitable ratio may be used.

In alternate embodiments, motor 2090C, drive pulley 2110C, tensioner 2150C and belt 2116 may drive an additional forearm/substrate holder in a substantially similar manner as described above.

The procedure for moving substrates between a retracted position of the arm assembly 200', 200" and the substrate holding area 105b, or short extension station, is substantially as follows. Substrate holding area 105b is so called a short extension station because the arm 200', 200" remains "folded over itself" during extension and placement of the substrate 106. Referring to FIGS. 2, 3A-3H, 3J, 6 and 8 as noted before, a substrate transport is provided having three independently driven driveshafts 668a, 668b, 668c (FIG. 6) or 1150, 1174, 1199 (FIG. 11), an upper arm 201, a forearm 202 and a substrate holder 203 (as shown in 801, 802 of FIG. 8). The first, second and third drives 662, 664, 666 (FIG. 6) or 1148, 1179, 1190 (FIG. 11) are energized and instructed by the controller 208 to individually rotate their respective drive shafts 668a, 668b, 668c (FIG. 6) or 1150, 1174, 1199 (FIG. 11) as shown in 803 of FIG. 8. The drive shafts 668a, 668b, 668c (FIG. 6) or 1150, 1174, 1199 (FIG. 11) may be individually rotated in either a clockwise or counterclockwise direction. The controller 208 may control the drive section 204, 204" to substantially rotate and extend or retract the arm assembly 200', 200" in a compound "R" movement (as seen in FIGS. 3A-3H and 3J). To achieve the compound "R" movement of the arm assembly 200', 200" the drive shafts 668a, 668b, 668c (FIG. 6) or 1150, 1174, 1199 (FIG. 11) may be independently rotated at dissimilar rates. The dissimilar rates of rotation of the drive shafts results in dissimilar rates of rotation of the upper arm 201, the forearm 202 and the substrate holder 203.

Figure 3B:
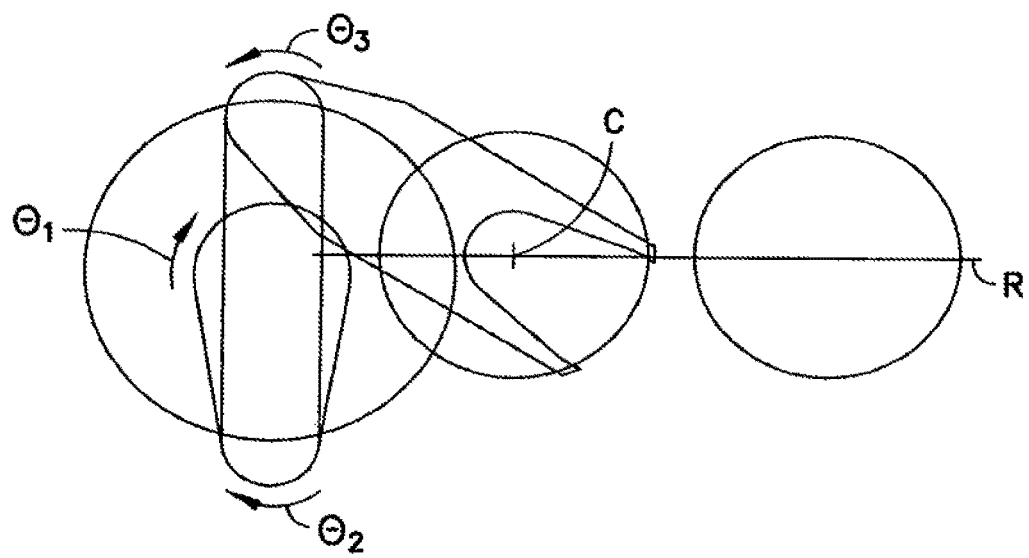
Figure 3C:
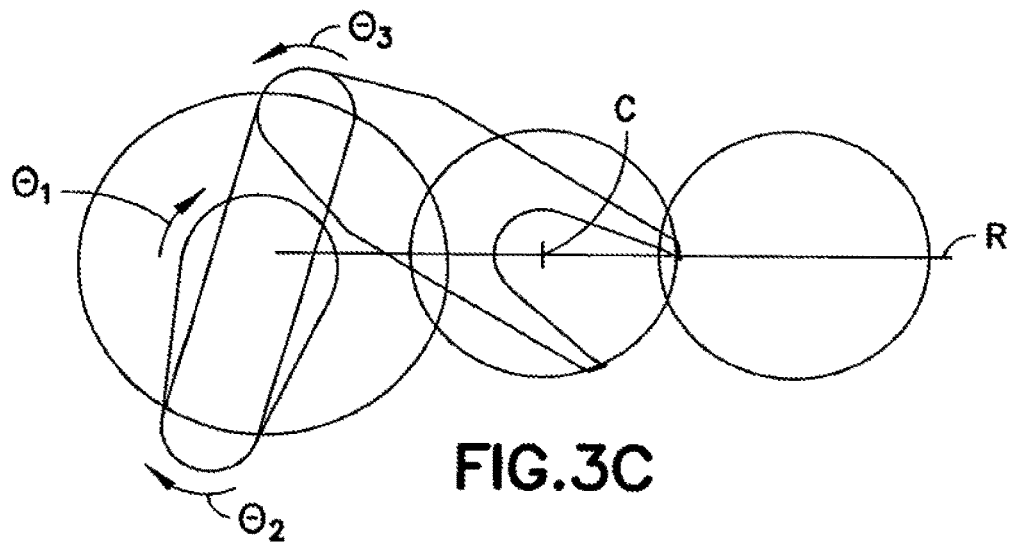
Figure 3D:
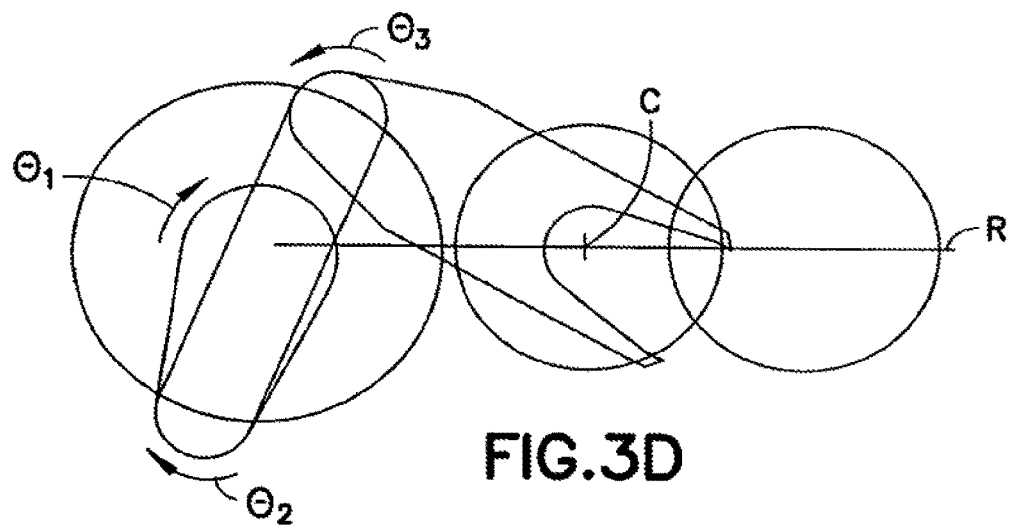
Figure 3E:
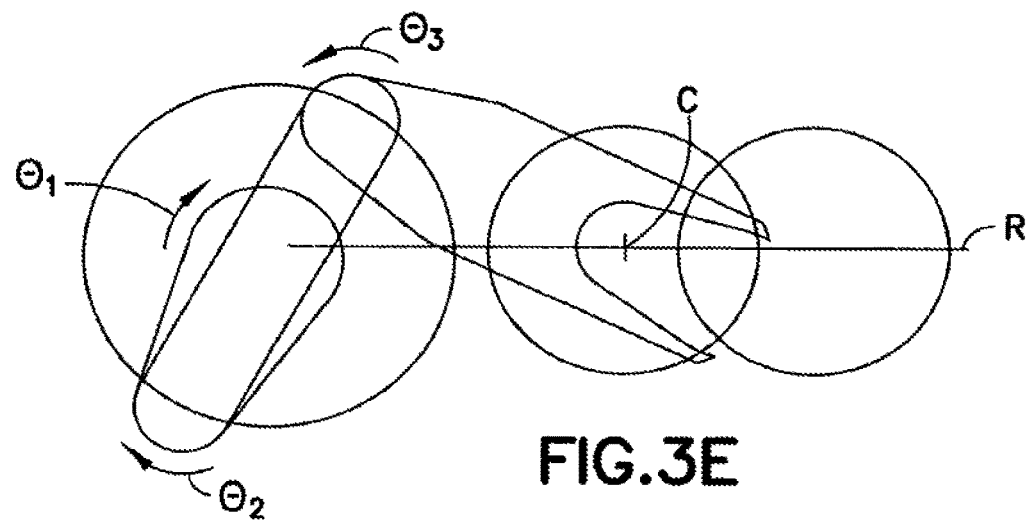
Figure 3F:
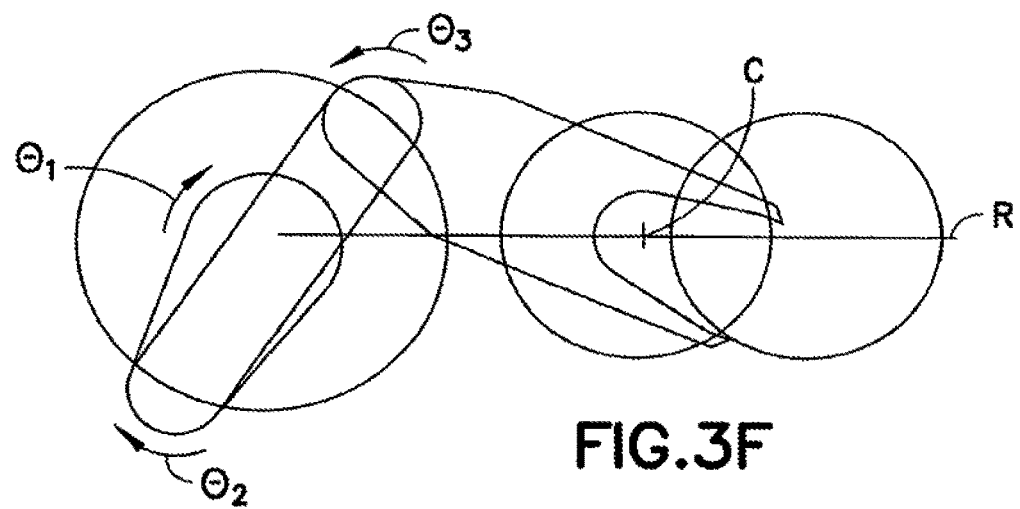
Figure 3G:
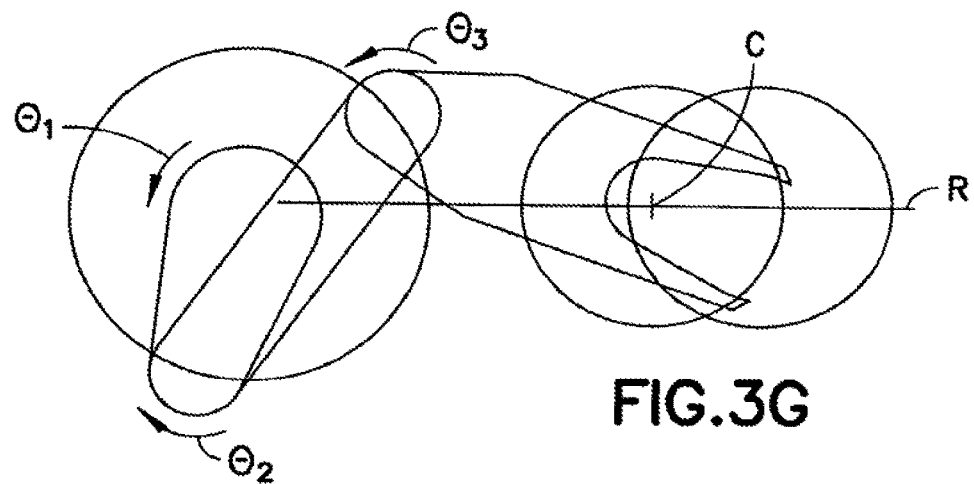
Figure 3H:
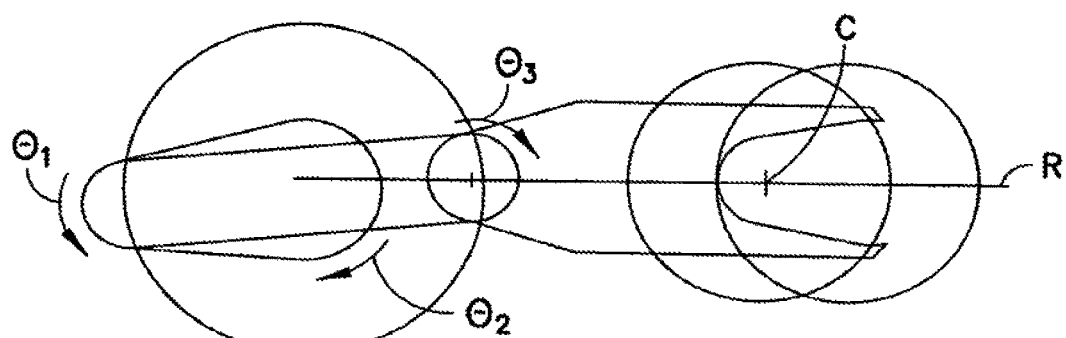
Figure 3J:
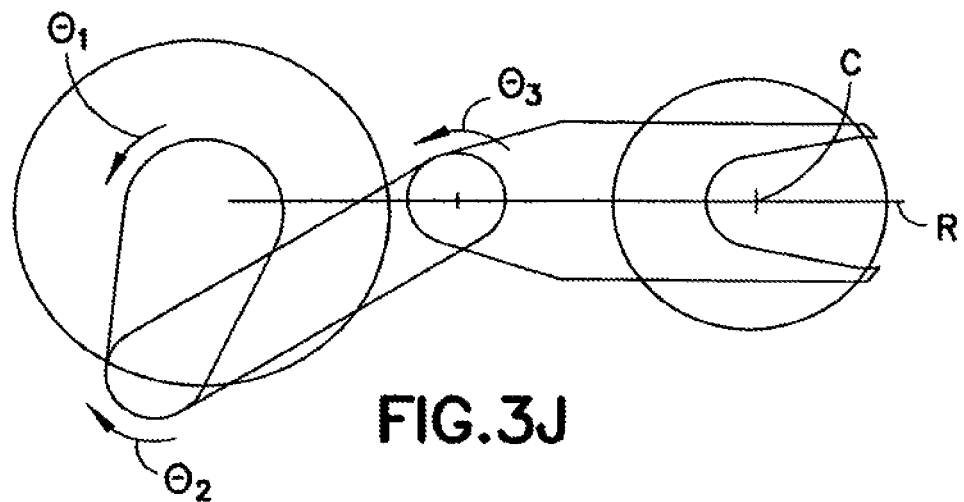

FIGS. 3A-H and 3J illustrate the rotation of the upper arm 201, forearm 202 and substrate holder 203 when translating into substrate holding area 105b (FIG. 2). For example, when arm 200', 200" begins extending from the retracted position shown in FIG. 3A, the upper arm 201 and forearm 202 rotate clockwise θ1, θ2 while the substrate holder 203 rotates counterclockwise θ3 as seen in FIG. 3B. At a point during the translation the rotational direction θ1 of the upper arm 201 may change from clockwise to counterclockwise to continue the translation of a substrate 106 along the radial line R as seen in FIGS. 3F and 3G. Likewise, the rotational direction θ2, θ3 of the substrate holder 203 and the forearm 202 may also change so that the substrate holder is rotated clockwise and the forearm is rotated counterclockwise to effect the translation of a substrate 106 along the substantially radial line R as seen in FIG. 3H.

During extension of the arm 200', 200" along substantially radial line R, and as can be seen in FIGS. 3B-3H and in 804 of FIG. 8, the center C of substrate 106 is located along line R. The substrate holder 203 rotates about the center C of the substrate 106 so that the substrate is translated rectilinearly along radial line R. Accordingly, once the wrist 755 is placed along line R, as seen in FIG. 3H, the rotation of the substrate holder 203 relative forearm 202 and upper arm 201 becomes such that while forearm 202 and upper arm 201 are rotated to effect extension of the arm, the wrist 755 and the center C of the substrate 106 remain along radial line R. Thus, the substrate holder 203 is longitudinally aligned (i.e. the center of the substrate and wrist joint axis are located on transport path) with the line R during translation. The paths of translation 501, 502 of the wrist 755 and the center C of the substrate 106 are illustrated in FIG. 5. The substrate and the wrist joint axis being longitudinally aligned during transport allows the substrate holder 203 to miss and not violate the SEMI exclusion areas 500.

Figure 4:
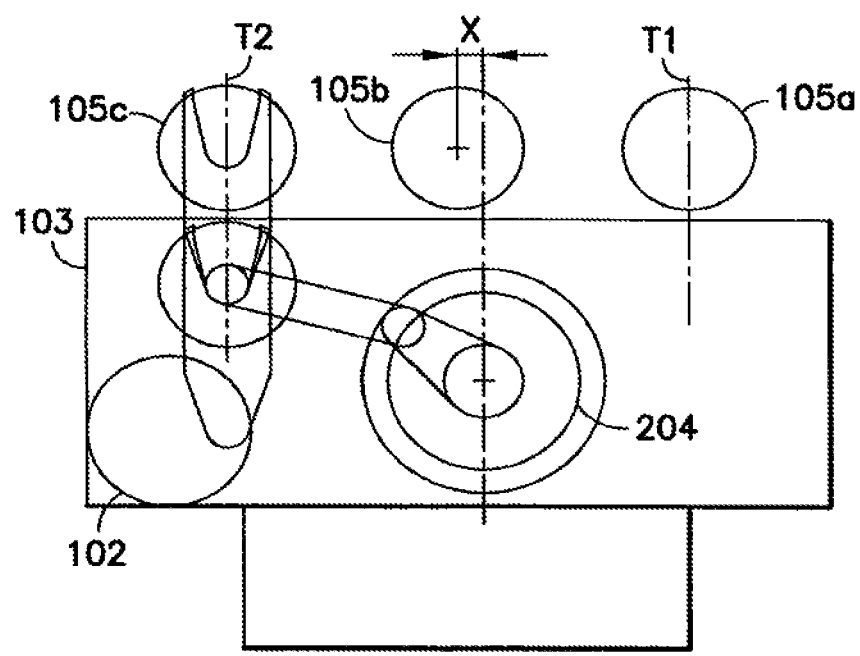
FIG. 4 is another schematic top plan view of a substrate processing apparatus in accordance with another exemplary embodiment.

Any interference that may exist between the substrate holder 203 and the FOUP exclusion area 500 of holding area 105*b*, as defined in the SEMI Standards, during the extension of arm 200', 200" along line R may be eliminated. In this exemplary embodiment, the transport arm is shown located with shoulder axis Z1 offset by an amount "X" as can be seen in FIG. 4. In alternate embodiments, the arm may be located so there is no offset between the shoulder axis and the transport path into holding areas similar to 105*b*. In other alternate embodiments the difference between the length of the upper arm 201 and the forearm 202 may be varied as desired.

When the arm 200', 200" translates the substrate 106 to its desired location within the substrate holding area 105*b* the substrate may be released by the substrate holder 203 and placed within the substrate holding area 105*b*. To release the substrate 106 from the grip of the substrate holder, an active gripping mechanism of the substrate holder (not shown) may open to release the substrate. In alternate embodiments, a vacuum holding the substrate 106 on the substrate holder may be turned off to release the substrate. In yet another alternate embodiment any suitable gripping of the substrate may be deactivated to release the substrate. Picking a substrate from a holding area and hence the gripping of a substrate is performed in substantially the reverse manner as releasing the substrate.

Retraction of the arm 200', 200" is accomplished in a substantially reverse manner from that used to extend the arm 200', 200" into substrate holding area 105*b* along radial line R. In alternate embodiments, vertical translation of the arm 200', 200" may be provided by a linear drive (not shown) drivingly connected to the drive section 204. Extension and retraction of arm 200', 200" into any other short extension station is accomplished in substantially the same manner as described above.

The procedure for moving substrates between a retracted position of the arm assembly 200', 200" and the substrate holding area 105*a*, or long extension station, is substantially as follows. Substrate holding area 105*a* is so called a long extension station because the upper arm 201, forearm 202 and substrate holder 203 extend such that the arm 200' is not "folded over itself" during translation of a substrate 106 into a holding area.

Figure 9:
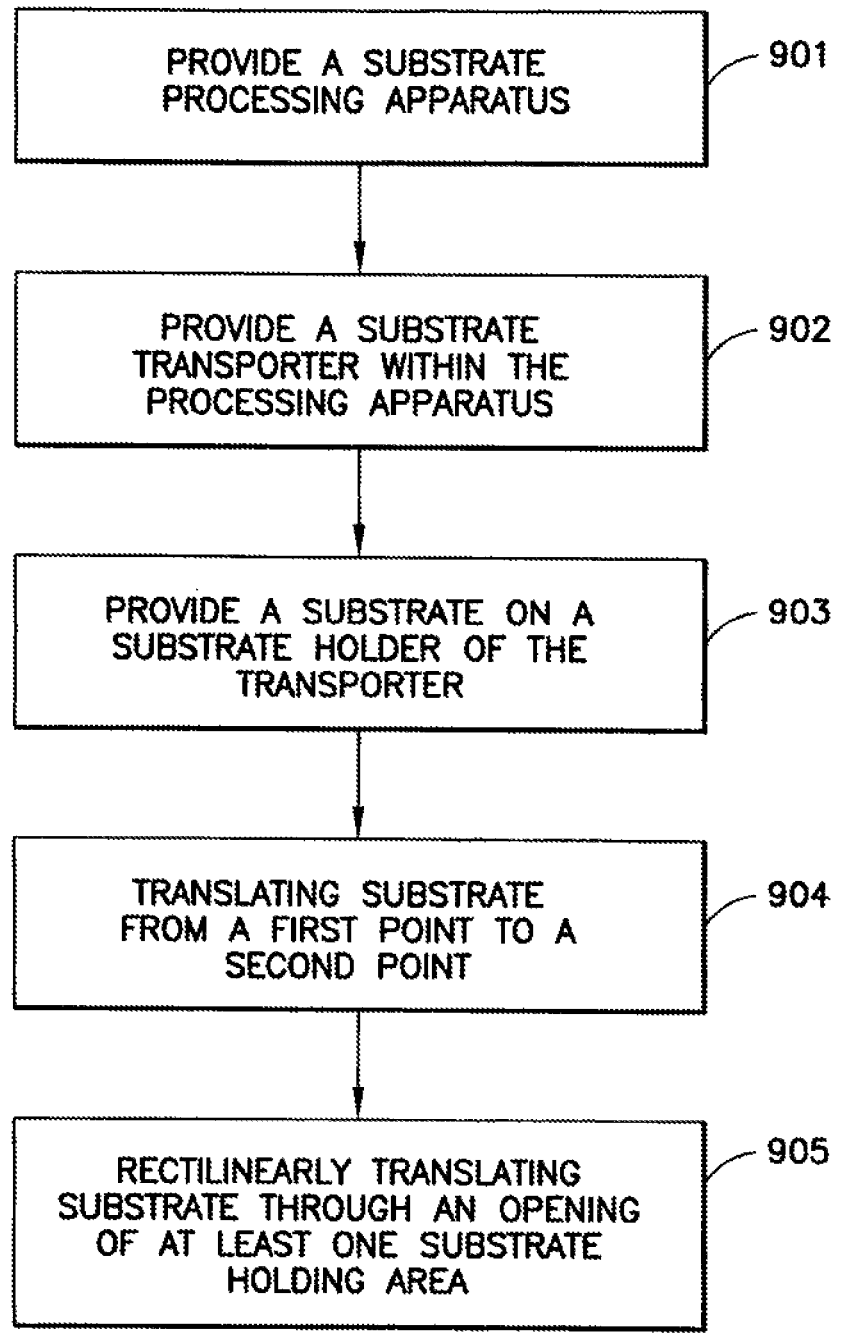
FIG. 9 is a flow diagram in accordance with another method of an exemplary embodiment.

Referring now to FIGS. 1, 2, 4, 6, and 9 a substrate processing apparatus 100 and substrate transporter 200 are provided (as shown in 901 and 902 of FIG. 9). A substrate 106 is also provided on the substrate holder 203 of transporter 200 as shown in 903 of FIG. 9. Extending from the retracted position of the arm 200', 200" (as can be seen best in FIGS. 1 and 5) the three drives 662, 664, 666 (FIG. 6) or 1149, 1179, 1190 (FIG. 11) of the transporter 200 are energized and instructed by the controller 208 to independently rotate their respective drive shafts 668*a*, 668*b*, 668*c* (FIG. 6) or 1150, 1174, 1199 (FIG. 11), thus rotating the upper arm 201, the forearm 202 and the substrate holder 203. Drive shafts 668*a*, 668*b*, 668*c* (FIG. 6) or 1150, 1174, 1199 (FIG. 11) may be rotated either clockwise or counterclockwise as described above. As the upper arm 201, forearm 202 and substrate holder 203 are rotated, the substrate 106 is translated from point P1 (as seen in FIG. 3A) to point P2 (as seen in FIG. 2) which may be located proximate to the substrate holding area 105*a* as shown in 904 if FIG. 9. In alternate embodiments, point P2 may be located in any desired position within the processing apparatus.

The controller 208 may control the drive section to substantially rotate and extend or retract the arm assembly 200', 200" in a compound "T" movement (as seen in FIGS. 2 and 4) along path T1 to rectilinearly translate the substrate holder 203 into holding area 105*a*. Thus, the arm 200', 200" rectilinearly translates substrate 106 into holding area 105*a* as shown in 905 of FIG. 9. To achieve the compound "T" movement of the arm assembly 200' the drive shafts 668*a*, 668*b*, 668*c* (FIG. 6) or 1150, 1174, 1199 (FIG. 11) may be independently rotated at dissimilar rates. The dissimilar rates of rotation of the drive shafts result in dissimilar rates of rotation of the upper arm 201, the forearm 202 and the substrate holder 203. For example, as can be seen in FIG. 2, when arm 200', 200" is translating into substrate holding area 105*a* from point P2 the upper arm 201 is rotated counterclockwise θ1 about axis Z1, the forearm 202 is rotated counterclockwise θ2 about axis Z2 and the substrate holder 203 is rotated clockwise θ3 about axis Z3. During the "T" movement the substrate holder 203 may remain longitudinally aligned, for example, with path T1 so that during translation into area 105*a*, the substrate holder is orthogonal to the substrate holding area 105*a*.

Retraction of the arm 200', 200" is accomplished in a substantially reverse manner from that used to extend the arm 200', 200" into substrate holding area 105*a*. In alternate embodiments, vertical translation of the arm 200', 200" may be provided by a linear drive drivingly connected to the drive section 204, 204'. Extension and retraction of arm 200', 200" into any other long extension station, for example 105*c*, is accomplished in substantially the same manner as described above.

In the exemplary embodiment shown in FIG. 10, transport arm 200''' is substantially similar to transport arms 200' and 200". Transport arm 200''' has substantially the same footprint to extension ratio and substantially the same forearm and upper arm lengths as arms 200' and 200". In this exemplary embodiment there are two substrate holding stations 105*d*, 105*e* rather than three (105*a-c*) as described above. The transporter 200''' may be placed in a position substantially between two axes of translation such as, for example, T3 and T4 of substrate holding areas 105*d*, 105*e* as shown in FIG. 10. In alternate embodiments the transporter may be placed in any desired position within the processing apparatus.

Translation of a substrate into substrate holding areas 105*d*, 105*e* along paths T3 and T4 is substantially the same as translation of a substrate into substrate holding areas 105*a*, 105*c* along paths T1 and T2. The controller 208 may control the drive section to substantially rotate and extend or retract the arm assembly 200''' in a compound "T" movement (as seen in FIGS. 2 and 4) along path T3 to rectilinearly translate the substrate holder 203 into holding area 105*d*. Thus, the arm 200''' rectilinearly translates substrate 106 into holding area 105*d*. To achieve the compound "T" movement of the arm assembly 200''' the drive shafts, such as shafts 668*a*, 668*b*, 668*c* (FIG. 6) or 1150, 1174, 1199 (FIG. 11) may be independently rotated at dissimilar rates. The dissimilar rates of rotation of the drive shafts result in dissimilar rates of rotation of the upper arm 201, the forearm 202 and the substrate holder 203 as described above with respect to translation along paths T1 and T2. During the "T" movement the substrate holder 203 may remain longitudinally aligned, for example, with path T3 so that during translation into area 105d, the substrate holder is orthogonal to the substrate holding area 105d.

The releasing, placing and picking of substrate into a long extension station is substantially performed as described above for the short extension stations. Substrate may also be picked and placed in a substrate staging area 101 (as seen in FIG. 1) in substantially the same manner as described above according to whether the staging area 101 is either a short or long extension area. The arm 200', 200" may also extend and retract, as described above, to place a substrate on a pre-aligner 102 (FIG. 1) so that a substrate fiducial may be oriented to a predetermined position before placement of the substrate into the staging area 101.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate transport apparatus comprising:
   a drive section;
   a controller operably connected to the drive section; and
   a substrate transport with an upper arm, forearm and substrate holder, a proximate end of the upper arm being rotatably mounted to the drive section at a shoulder joint, a proximate end of the forearm being rotatably mounted to a distal end of the upper arm at an elbow joint, the substrate holder being rotatably mounted to a distal end of the forearm at a wrist joint, the upper arm and the forearm being unequal in length from joint center to joint center;
   wherein the substrate transport is adapted to transport substrate to and from substrate holding areas with the drive section of the transport apparatus remaining in a fixed position relative to the substrate holding areas, the substrate holding areas comprising at least two side by side substrate holding areas facing a common direction on one side of the shoulder joint and at least two side by side substrate holding areas facing a common direction on another side of the shoulder joint, and the controller is configured to control the drive section for effecting radial line extension of the substrate transport so that the substrate is transported along a radial line to at least one of the at least two side by side substrate holding areas on one or more of the one side of the shoulder joint and the other side of the shoulder joint, and the upper arm, forearm and substrate holder are configured so that during the radial line extension, away from the shoulder joint to the at least one of the at least two side by side substrate holding areas on one or more of the one side of the shoulder joint and the other side of the shoulder joint, the substrate holder rotates about a center of the substrate during radial movement of the substrate and relative rotation between the upper arm and forearm changes direction during extension to offset motion along the radial line of extension and the wrist joint travels along parallel paths to each of the substrate holding areas.

2. The substrate transport apparatus of claim 1, wherein the upper arm is shorter than the forearm.

3. The substrate transport apparatus of claim 1, wherein the drive section comprises a first, second and third drives, the first drive being drivingly connected to a first drive shaft, the second drive being drivingly connected to a second drive shaft and the third drive being drivingly connected to a third drive shaft.

4. The substrate transport apparatus of claim 3, wherein the controller sends control signals to the first, second and third drives thereby effecting rotation of the upper arm, forearm and substrate holder.

5. The substrate transport apparatus of claim 3, wherein the upper arm is mounted to the first drive shaft to rotate in unison with the first drive shaft and the forearm is rotatably mounted to the upper arm to rotate relative to the upper arm.

6. The substrate transport apparatus of claim 5, wherein the substrate holder is rotatably mounted to the forearm to rotate relative to the forearm and the upper arm.

7. The substrate transport apparatus of claim 6, wherein the forearm is drivingly connected to the second drive shaft and the substrate holder is drivingly connected to the third drive shaft.

8. The substrate transport apparatus of claim 1, wherein the upper arm, forearm and substrate holder are rotated independently of each other effecting the translation of substrate into and out of the at least two side by side substrate holding areas.

9. The substrate transport apparatus of claim 1, wherein the substrate transport transports substrate rectilinearly into and out of the at least two side by side substrate holding areas along at least two parallel axes of translation corresponding to each of the at least two side by side substrate holding areas.

10. The substrate transport apparatus of claim 1, wherein the at least two side by side substrate holding areas comprise a first and second substrate holding areas being in line with respect to each other and equidistant from each other, the first and second substrate holding areas being oriented perpendicular to the axes of translation.

11. The substrate transport apparatus of claim 1, wherein the at least two side by side substrate holding areas comprise three side by side substrate holding areas including a first, second and third substrate holding areas being in line with respect to each other and equidistant from each other, the second substrate holding area being between the first and third substrate holding areas, the first, second and third substrate holding areas being oriented perpendicular to the axes of translation.

12. The substrate transport apparatus of claim 11, wherein a center of the drive section is offset from the axis of translation corresponding to the second substrate holding area and between the axes of translation corresponding to the first and third substrate holding areas.

13. The substrate transport apparatus of claim 1, wherein the substrate holder is independently rotated so that when the substrate transport is extended from a retracted position along a radial line, the wrist is rotating about a center of the substrate until a point where the center of the substrate and wrist can be placed along the radial line.

* * * * *